(12) United States Patent
Waltari

(10) Patent No.: US 9,323,226 B1
(45) Date of Patent: Apr. 26, 2016

(54) SUB-RANGING VOLTAGE-TO-TIME-TO-DIGITAL CONVERTER

(71) Applicant: IQ-Analog Corporation, San Diego, CA (US)

(72) Inventor: Mikko Waltari, Escondido, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 14/979,186

(22) Filed: Dec. 22, 2015

Related U.S. Application Data

(63) Continuation-in-part of application No. 14/927,077, filed on Oct. 29, 2015, now Pat. No. 9,281,834, which is a continuation-in-part of application No. 14/681,206, filed on Apr. 8, 2015, now Pat. No. 9,098,072.

(51) Int. Cl.
  *H03M 1/12* (2006.01)
  *G04F 10/00* (2006.01)
  *H03K 4/08* (2006.01)

(52) U.S. Cl.
  CPC ............... *G04F 10/005* (2013.01); *H03K 4/08* (2013.01); *H03M 1/122* (2013.01); *H03M 1/1295* (2013.01)

(58) Field of Classification Search
  CPC ... G04F 10/005; H03M 1/1295; H03M 1/122; H03M 1/50; H03K 4/08
  USPC .......................................... 341/156, 166, 155
  See application file for complete search history.

(56) References Cited

U.S. PATENT DOCUMENTS

| | | | |
|---|---|---|---|
| 5,886,660 A | 3/1999 | Lowenstein | |
| 6,501,706 B1 * | 12/2002 | West | G04F 10/00 368/118 |
| 7,557,746 B1 | 7/2009 | Waltari | |
| 7,609,756 B2 | 10/2009 | Wood | |
| 7,667,633 B2 | 2/2010 | Choi et al. | |
| 7,893,861 B2 * | 2/2011 | Bulzacchelli | H03M 1/20 341/155 |
| 7,932,847 B1 * | 4/2011 | Hsieh | G04F 10/005 341/155 |
| 8,064,561 B2 * | 11/2011 | Henzler | G01R 31/31709 375/371 |
| 8,138,843 B2 | 3/2012 | Straayer et al. | |
| 8,421,661 B1 | 4/2013 | Jee et al. | |
| 8,433,025 B2 | 4/2013 | Sun et al. | |
| 8,552,901 B2 | 10/2013 | Danesh et al. | |
| 8,896,477 B2 | 11/2014 | Dosho et al. | |
| 8,970,420 B2 | 3/2015 | Henzler et al. | |
| 8,988,269 B2 | 3/2015 | Dosho | |
| 2014/0232827 A1 | 8/2014 | Kumar et al. | |
| 2015/0041625 A1 | 2/2015 | Dutton et al. | |

\* cited by examiner

*Primary Examiner* — Khai M Nguyen
(74) *Attorney, Agent, or Firm* — Law Office of Gerald Maliszewski; Gerlad Maliszewski

(57) ABSTRACT

A system and method are provided for converting voltage-to-time-to-digital signals. The method periodically samples a continuous analog input and discharges the sampled analog input at a predetermined rate to supply a continuous analog ramp signal. The ramp signal is converted into an n-bit coded digital word representing the q most significant bits (MSBs) of a k-bit binary word, where q is an integer greater than 0, n is an integer greater than 1, and k is an integer greater than q. At least one bit of the coded digital word is supplied at a time representing the p least significant bits (LSBs) of the k-bit binary word. The coded digital word is converted into a single-bit pulse signal containing timing information representing the p LSBs of the k-bit binary word at an output, and the timing information is converted into the p LSBs of the k-bit binary word.

19 Claims, 7 Drawing Sheets

Fig. 1 *(PRIOR ART)*
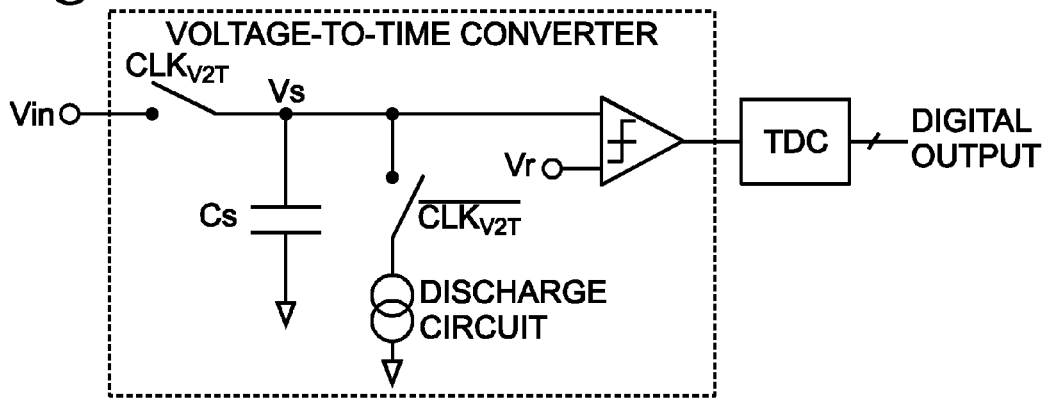
Fig. 2 *(PRIOR ART)*
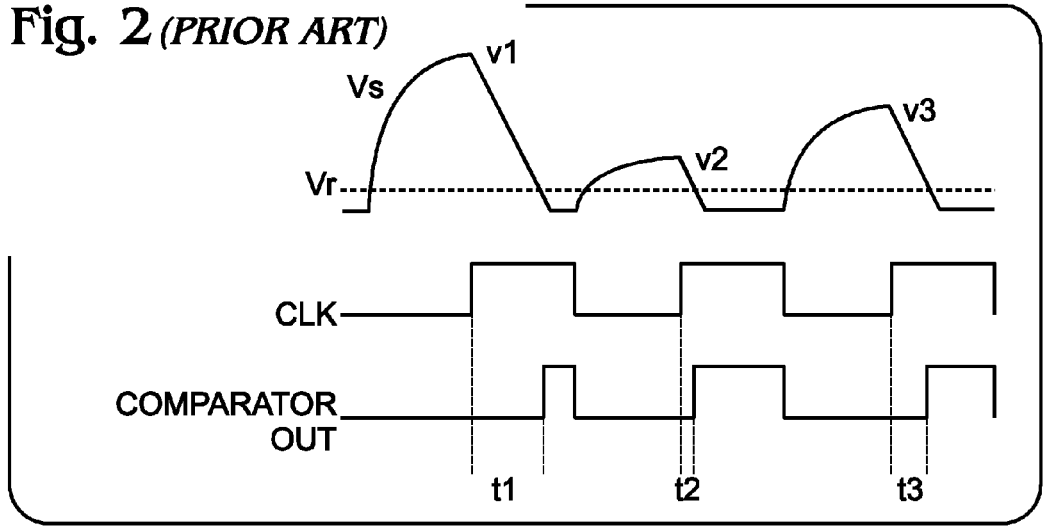
Fig. 3 *(PRIOR ART)*
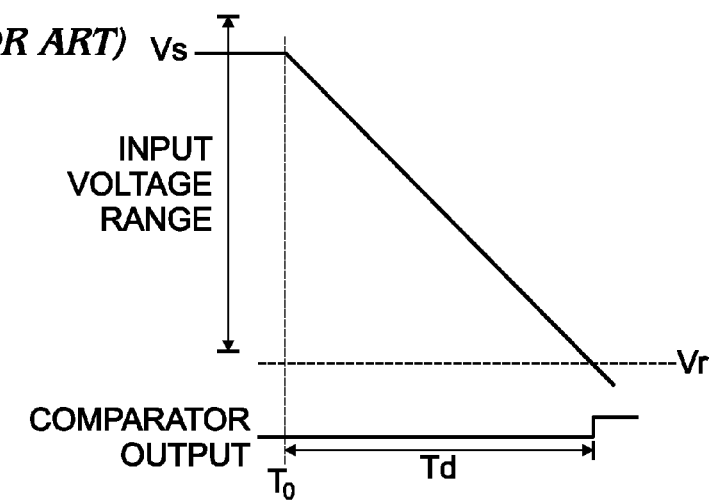

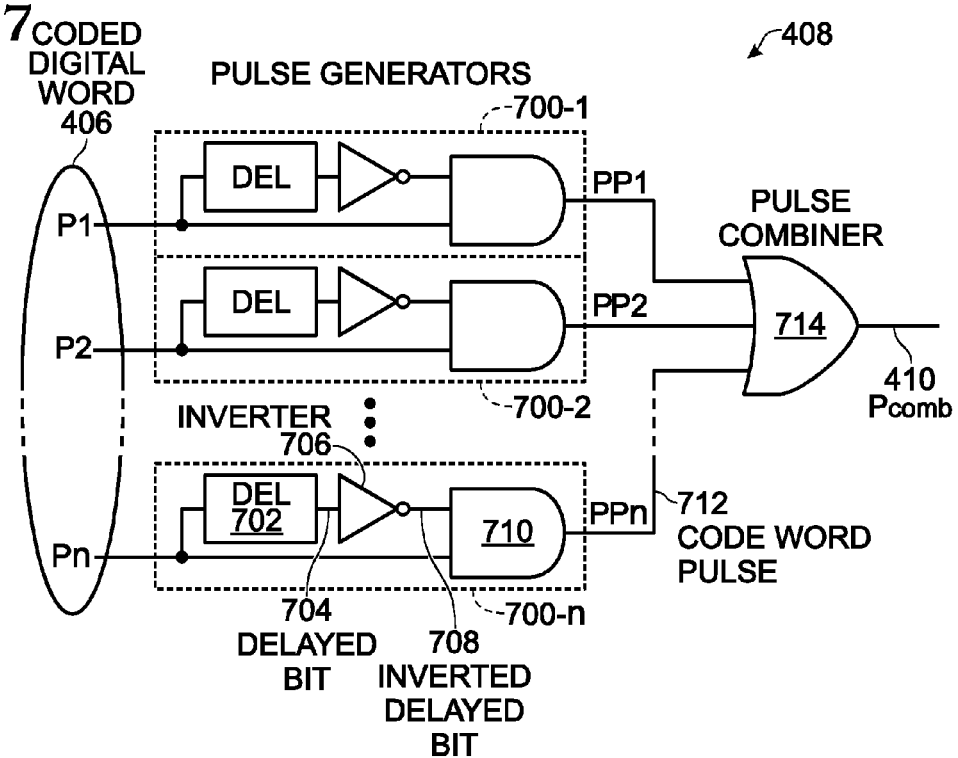
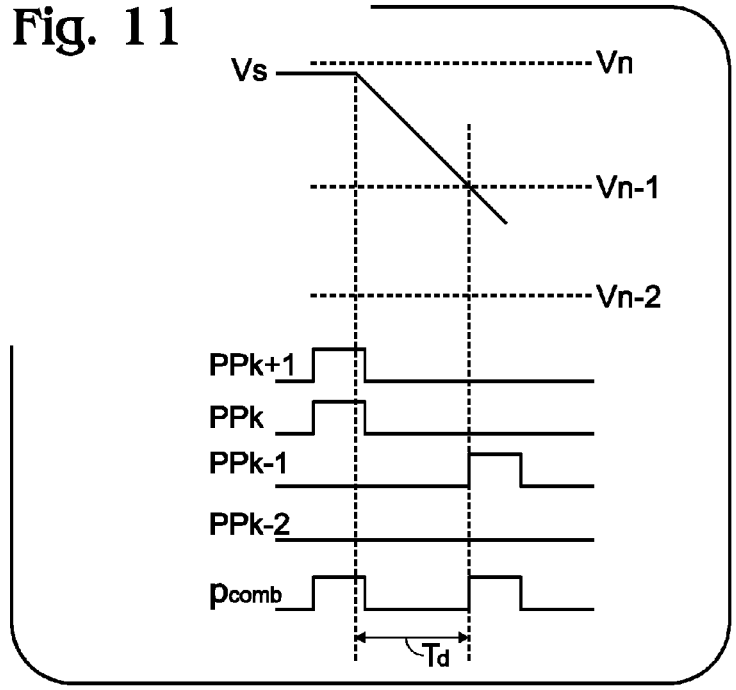

SUB-RANGING VOLTAGE-TO-TIME-TO-DIGITAL CONVERTER

RELATED APPLICATIONS

The following applications are incorporated herein by reference:

N-PATH INTERLEAVING ANALOG-TO-DIGITAL CONVERTER (ADC) WITH OFFSET GAIN AND TIMING MISMATCH CALIBRATION, invented by Mikko Waltari, Ser. No. 14/927,077, filed Oct. 29, 2015.

TRAVELING PULSE WAVE QUANTIZER, invented by Mikko Waltari, Ser. No. 14/681,206, filed Apr. 8, 2015; issued as U.S. Pat. No. 9,098,072;

BACKGROUND OF THE INVENTION

1. Field of the Invention

This invention generally relates to analog-to-digital converters (ADCs) and, more particularly, to a system and method for converting voltage-to-time, and then time-to-digital information.

2. Description of the Related Art

One promising way of performing very high speed analog-to-digital (A-to-D) conversion in today's most advanced CMOS technologies is to utilize time domain analog signal processing. There, the A-to-D conversion process is split in two steps. In the first step the input voltage is converted into a time domain signal using pulse position or pulse width modulation. In the second step this signal is digitized using a time-to-digital converter (TDC). The advantage of this method is that most of the complexity of the design is in the TDC part, which can be implemented in digital, or digital like circuitry that enjoys all the benefits of technology scaling of the CMOS process. A well-known example of this type of ADC is the single-slope ADC, which uses a simple digital counter as TDC.

FIG. 1 is a simplified schematic of an ADC comprised of a voltage-to-time (V2T) converter and a TDC based upon a single slope principle (prior art).

FIG. 2 is a waveform illustrating the operation of voltage to time conversion over three clock cycles (prior art).

FIG. 3 is the signal transfer function from comparator input to comparator output in the circuit of FIG. 1 (prior art). In the first phase of a clock cycle the input voltage Vin is sampled into capacitor Cs through a switch, which is opened at the end of the phase. In the second phase the capacitor is discharged at a constant rate producing a voltage ramp as shown in FIGS. 2 and 3. A comparator is used to detect when the ramp reaches a predefine reference voltage level Vr. The length of the time interval ($T_d$) from the start of the ramp ($T_0$) until the moment the comparator fires is proportional to the voltage sampled into the capacitor. The ramp rate, which is determined by the capacitor size and the discharge current, defines the voltage to time conversion factor $k_{VT}$. The duration of the ramp cannot exceed the period of the sampling, or in practice some fraction of it, as some time has to be reserved for sampling the input signal and transitioning between the phases. This restriction puts an upper limit on $k_{VT}$ for a given sampling rate.

The resolution, or dynamic range of an ADC is determined by the ratio of the largest allowable input signal and the smallest signal that can be detected. When the digitization occurs in the time domain, the smallest signal is equivalent to the least significant bit (LSB) of the TDC, which is ultimately limited by thermal noise, manifesting itself as jitter in the time domain. In addition to the noise, the LSB accuracy is affected by static and dynamic mismatch of the circuit elements. While in principle these effects can be measured and calibrated out, the smaller the LSB size, the more complex the calibration becomes. Further, lowering the noise usually comes at the cost of increased power consumption. For these reasons it is more attractive to increase the dynamic range by increasing the maximum input signal level than reducing the size of the LSB. In high speed applications the link between the maximum value of $k_{VT}$ and the V2T sampling rate sets the limit for maximum signal level in the time domain.

It would be advantageous if the dynamic range of an ADC could be increased without reducing the TDC LSB size.

SUMMARY OF THE INVENTION

Disclosed herein are a system and method that split the voltage ramp of a voltage-to-time (V2T) converter into several sub-ranges, and perform a time-to-digital conversion (TDC) inside a sub-range. The most significant bits (MSBs) of a coded digital word are supplied by the V2T converter, as determined by the sub-range in which the input signal is located, and the least significant bits (LSBs) are determined by the TDC. With this technique the dynamic range of the TDC only has to cover the span of one sub-range, increasing the overall analog-to-digital converter (ADC) resolution by $\log_2(n)$ bits, where n is the number of sub-ranges. This method bears some resemblance to the sub-ranging and folding techniques used in voltage domain ADCs. One way to view the ADC described herein is as a hybrid consisting of a voltage domain flash type front-end and a time domain back-end.

Accordingly, a method is provided for converting voltage-to-time-to-digital signals. The method periodically samples a continuous analog input and discharges the sampled analog input at a predetermined rate to supply a continuous analog ramp signal. The method converts the ramp signal into an n-bit coded digital word representing the q most significant bits (MSBs) of a k-bit binary word, where q is an integer greater than 0, n is an integer greater than 1, and k is an integer greater than q. At least one bit of the coded digital word (depending on the input voltage) is supplied at a time representing the p least significant bits (LSBs) of the k-bit binary word. The coded digital word is converted into a single-bit pulse signal containing timing information representing the p LSBs of the k-bit binary word, and the timing information is converted into the p LSBs of the k-bit binary word. The timing information is then converted into the p LSBs in response to a difference in time between the start of the ramp signal and the start of the single-bit pulse signal. Further, the coded digital word is converted into the q MSBs of the k-bit binary word. In one aspect, a look-up table (LUT) is accessed to retrieve a calibration code cross-referenced to the q MSBs from the k-bit binary word, and the calibration code is summed with the p LSBs to supply the k bit binary word.

The ramp signal is converted into the coded digital word by comparing the ramp signal to n parallel voltage references. Each voltage reference has a different potential within a range between a maximum ramp signal voltage and a minimum ramp signal voltage. The coded digital word is converted into a single-bit pulse signal containing timing information by converting the bits in the coded digital word into code word pulses having a predetermined pulse width, and then ORing (ORing) the code word pulses to supply the single-bit pulse signal.

Additional details of the above-described method and a voltage-to-time-to-digital converter (VTDC) are provided below.

BRIEF DESCRIPTION OF THE DRAWINGS

FIG. 1 is a simplified schematic of an ADC comprised of a voltage-to-time (V2T) converter and a TDC based upon a single slope principle (prior art).

FIG. 2 is a waveform illustrating the operation of voltage to time conversion over three clock cycles (prior art).

FIG. 3 is the signal transfer function from comparator input to comparator output in the circuit of FIG. 1 (prior art).

FIG. 7 is a schematic block diagram depicting an exemplary combiner.

FIG. 11 illustrates exemplary waveforms associated with the combiner of FIG. 7.

DETAILED DESCRIPTION

Figure 4:
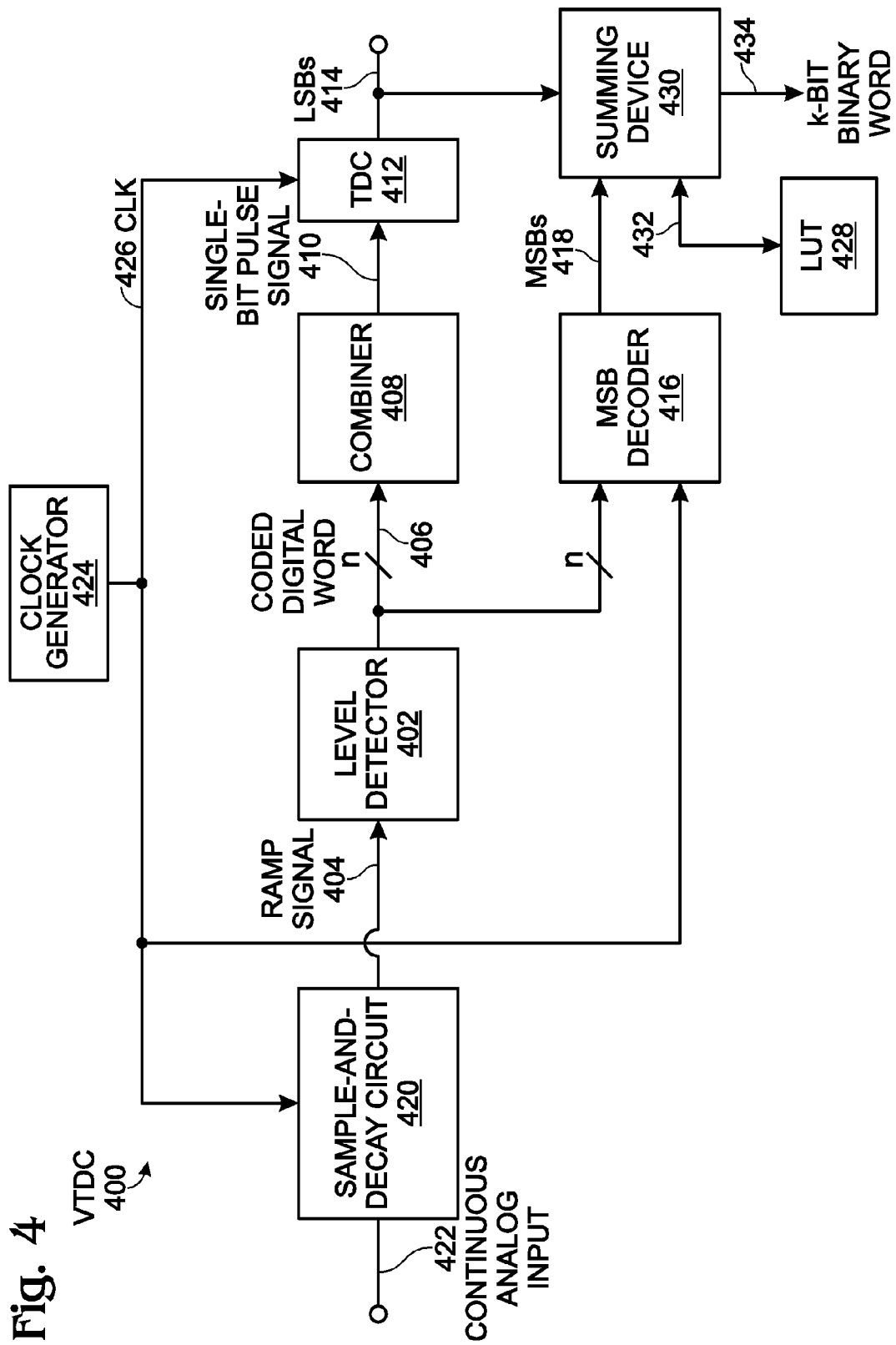
FIG. 4 is a schematic block diagram depicting a voltage-to-time-to-digital converter (VTDC).

FIG. 4 is a schematic block diagram depicting a voltage-to-time-to-digital converter (VTDC). The VTDC 400 comprises a level detector circuit 402 to accept, on line 404, a continuous analog ramp signal representing a sampled continuous analog input. The level detector circuit 402 converts the ramp signal into an n-bit coded digital word representing the q most significant bits (MSBs) of a k-bit binary word, where q is an integer greater than 0, n is an integer greater than 1, and k is an integer greater than q. The level detector circuit 402 supplies at least one bit of the coded digital word at a time representing the p least significant bits (LSBs) of the k-bit binary word at an output on line 406. As explained in more detail below, the number of bits in the coded digital word is dependent upon the amplitude of the analog input. A combiner 408 has n parallel inputs connected to the output of the level detector circuit 402. The combiner 408 converts the coded digital word and supplies a single-bit pulse signal at an output on line 410 containing timing information representing the p LSBs of the k-bit binary word. A time-to-digital converter (TDC) 412 has an input on line 410 to accept the single-bit pulse signal. the TDC 412 converts the timing information into the p LSBs of the k-bit binary word supplied at an output on line 414.

A MSB decoder 416 has an input to accept the coded digital word on line 406 and an output on line 418 to supply the q MSBs of the k bit binary word. A sample-and-decay circuit 420 has an input on line 422 to accept a continuous analog input. The analog input is typically a voltage but, alternatively, may be a current. The sample-and-decay circuit 420 periodically samples the continuous analog input and discharges the sampled analog input at a predetermined rate, thus supplying the ramp signal at an output on line 404.

The TDC 412 supplies the p LSBs on line 414 in response to a difference in time between the start of the ramp signal and the start of the single-bit pulse signal. More explicitly, the VTDC 400 further comprises a clock generator 424 having an output on line 426 to supply a periodic clock signal (CLK). The sample-and-decay circuit 420 has an input on line 426 to accept the clock signal, and it periodically samples the continuous analog input on line 422 in response to the clock signal. Likewise, the TDC 412 has an input on line 426 to accept the clock signal, and it converts the single-bit pulse signal timing information into the p LSBs with reference to the clock signal. For simplicity, a clock with a single output frequency is depicted. However, the TDC 412 and sample-and-decay circuit 420 (as well as the MSB decoder 416) may alternatively be clocked at different, but proportionally related frequencies.

Figure 5:
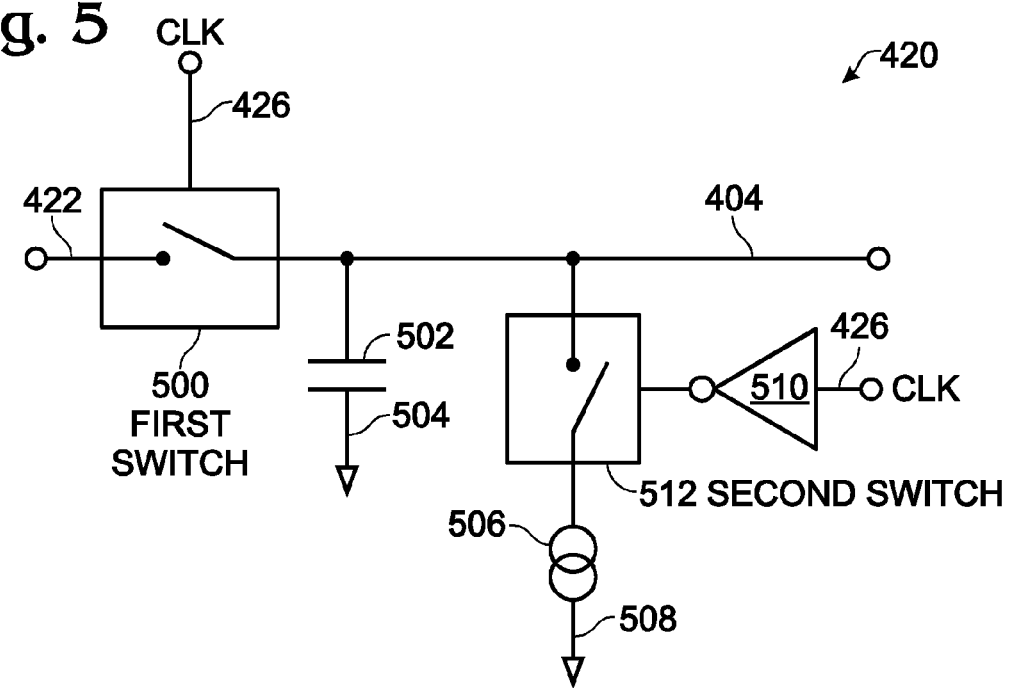
FIG. 5 is a schematic block diagram of an exemplary sample-and-decay circuit.

FIG. 5 is a schematic block diagram of an exemplary sample-and-decay circuit. In one aspect, the sample-and-decay circuit 420 comprises a first switch 500 having an input on line 422 to accept the continuous analog input, a control port to accept the clock signal on line 426, and an output on line 404. A capacitor 502 has a first terminal connected to the first switch output on line 404 and a second terminal connected to a reference voltage on line 504. A discharge circuit 506 has an input connected to the first terminal of the capacitor on line 404, an input to accept a control signal enabled in response to a complement of the clock signal, an input connected to a reference voltage on line 508, and an output on line 404 to supply a discharge current. As an example, the clock signal complement may be created by inverter 510 and used to control a second switch 512. A number of discharge circuit designs would be available to one with ordinary skill in the art. For instance, the discharge circuit can be a switched current source or, alternatively, a switched resistor.

Figure 6:
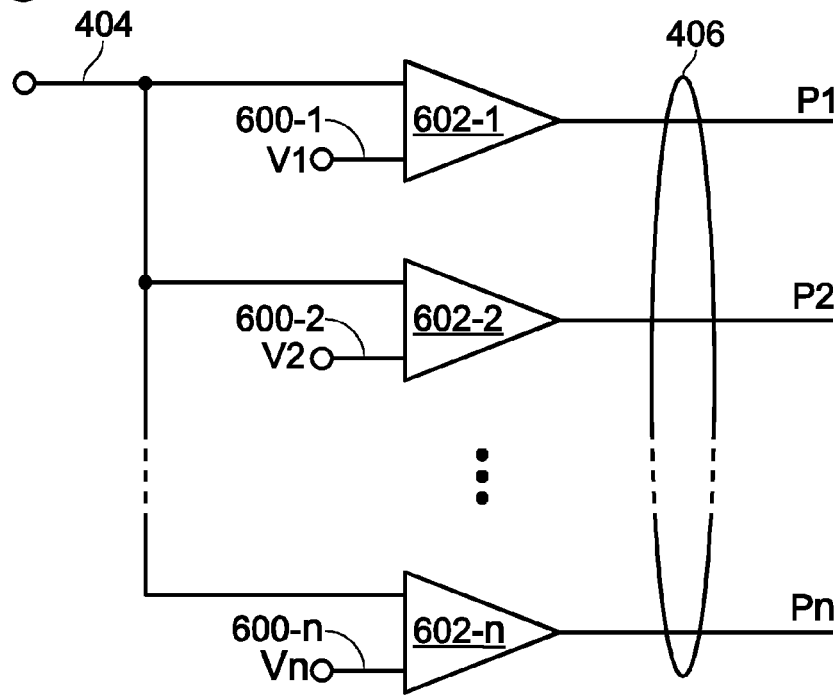
FIG. 6 is a schematic block diagram depicting an exemplary level detector circuit.

FIG. 6 is a schematic block diagram depicting an exemplary level detector circuit. The level detector circuit 402 comprises n voltage references V1 through Vn, respectively on lines 600-1 through 600-n. Each voltage reference has a different potential within a range between a maximum ramp signal voltage and a minimum ramp signal voltage. The reference voltages may be supplied by power supplies or, more typically, through the use of a resistor divider network as is well known in the art. There are n comparators 602-1 through 602-n. Each comparator has a first input on line 404 to accept the ramp signal, a second input connected to a corresponding voltage reference, and an output on line 406 to supply a corresponding bit of the coded digital word.

Returning to FIG. 4, in one aspect the VTDC 400 further comprises a look-up table (LUT) 428, which is a memory including calibration codes cross-referenced to MSBs from the kbit binary word. A summing device 430 has an input on line 418 to accept the q MSBs of the kbit binary word from the MSB decoder 416 and an input on line 414 to accept the p LSBs from the TDC 412. The summing device 430 accesses the LUT 428 via line 432 to retrieve the calibration code associated with the q MSBs, sums the calibration code with the p LSBs, and supplies the k-bit binary word at an output on line 434. Note: calibration codes may be used when there are known inaccuracies in the level detector voltage references, or when the comparators have known voltage or delay offsets.

FIG. 7 is a schematic block diagram depicting an exemplary combiner. The combiner 408 comprises n pulse generators 700-1 through 700-n. Taking pulse generator 700-n as an example, each pulse generator has a delay circuit 702 with a first delay duration to accept a corresponding bit of the coded digital word and to supply a delayed bit on line 704. An inverter 706 is connected to the delay output on line 704 and supplies an inverted delayed bit on line 708. An AND gate 710 has an input to accept the inverted delayed bit on line 708, an input to accept the bit of the coded digital word (e.g., $P_N$), and an output on line 712 to supply a code word pulse having a pulse width equal to the first delay duration. An OR circuit (pulse combiner) 714 has an n inputs. Each input is connected to a corresponding pulse generator output. The OR circuit 714 has an output to supply the single-bit pulse signal on line 410. The level detector circuit supplies the bits of the coded digital word at an interval between bits responsive to a slope of the ramp signal. Thus, the pulse generator delay circuits 702 have a first delay duration less than the interval. The purpose of generating a pulse is to provide a rising edge for the TDC to be digitized. The pulse needs to be long enough so as to not disappear in the downstream circuitry. On the other hand, since the pulse blocks other rising edges while high, it should not be so long as to prevent detecting the next rising edge of interest.

Figure 8:
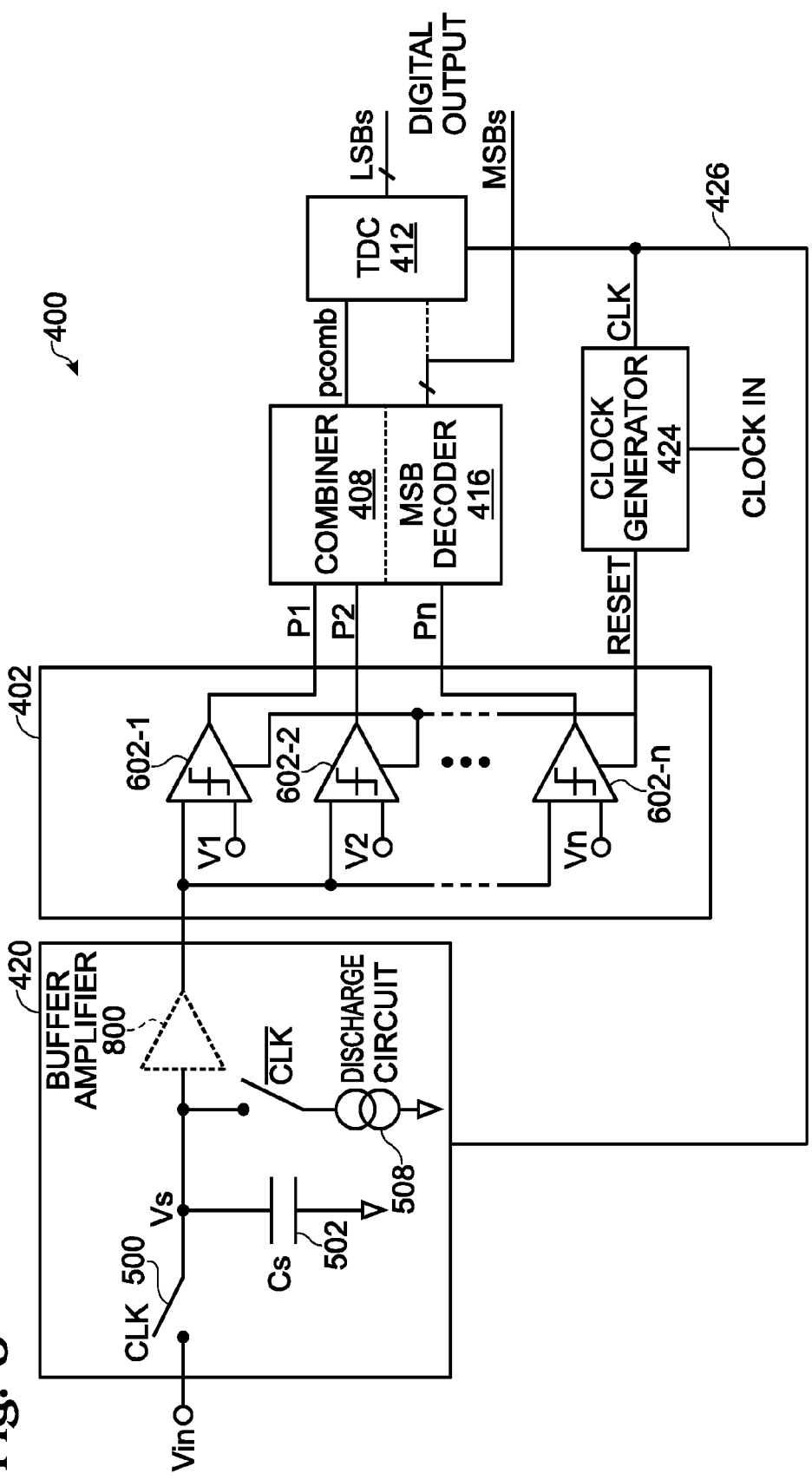
FIG. 8 is a schematic block diagram depicting aspects of the VTDC of FIG. 4 in greater detail.

FIG. 8 is a schematic block diagram depicting aspects of the VTDC of FIG. 4 in greater detail. The input voltage is sampled into a capacitor 502 through a switch 500 during first phase of the clock period. In parallel with the capacitor 502 is a discharge circuit 506 that discharges the capacitor preferably, but not necessarily, at constant rate during the second phase of the clock period. The discharge circuit 506 can be enabled, for instance, as a switchable current source or a resistor. The capacitor voltage (ramp signal) is also connected to the first inputs of a bank of n comparators or limiting amplifiers. Optionally, a buffer amplifier 800 can be inserted between the capacitor 500 and the comparators 602-1 through 602-n to isolate the comparator input capacitance from the sampling node. The second inputs of the comparators are connected to n fixed, usually evenly spaced, reference voltages V1 through Vn. This forms a structure similar to a flash ADC.

The comparator outputs are combined in combiner block 408 and sent to the TDC 412. In parallel with the combiner is a MSB decoder block 416 that uses the same comparator outputs to generate the MSBs of the final binary output. Optionally, the MSB information is also sent to the TDC to indicate edge direction as will be explained later. A clock generator 424 uses a master input clock on line 802 and provides the clock signals to the TDC 412 and V2T block 420. In one aspect of the invention the comparators also receive a reset signal on line 804 that prepares them for a new input sample after the previous one has been processed. The clock signals for the V2T 420 and TDC 412 don't have to be at the same frequency. In some situations it can be advantageous to run the TDC at oversampled clock rate, which is typically an integer multiple of the V2T clock rate.

Figure 9:
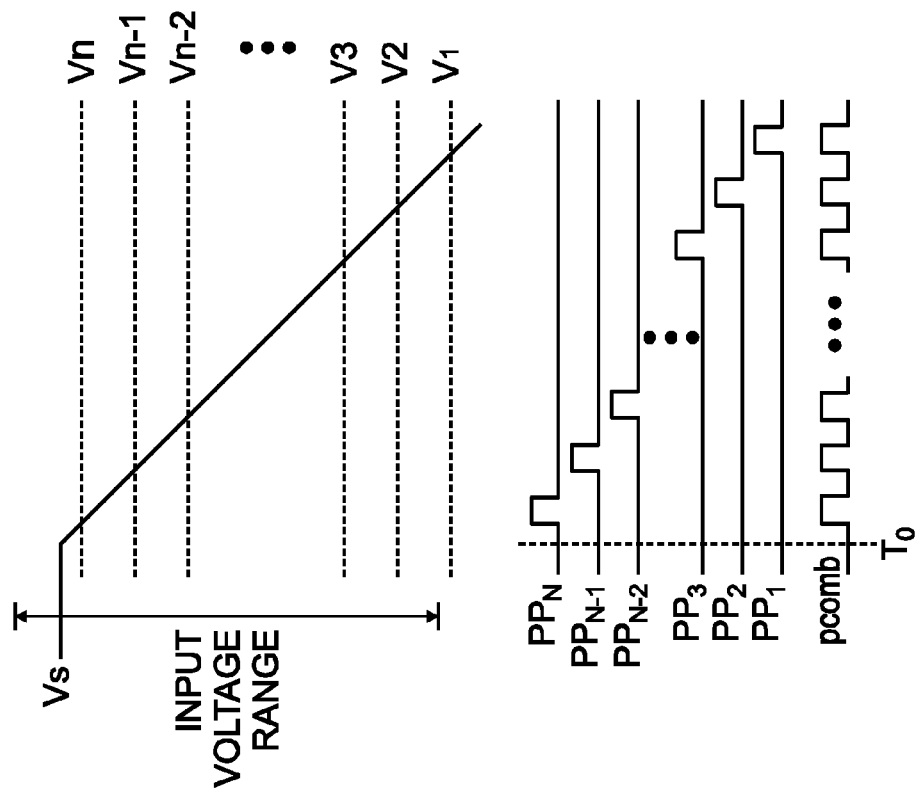
FIG. 9 is a diagram showing the signal waveforms during the discharge phase.

FIG. 9 is a diagram showing the signal waveforms during the discharge phase. It should be noted that the direction of the ramp from a high voltage value to a low voltage can just as well be oppositely chosen without affecting the general idea. Another thing to note is that in this illustration the voltage ramp starts above the threshold level (Vn) of the topmost comparator and continues all the way below that threshold level of the bottommost comparator (V1). This is done only to show the entire transfer function of the circuit. As is explained below, during normal operation the ramp can start anywhere within the valid input voltage range indicated on the left of the ramp signal graph, and is typically much shorter in duration, spanning just little over the distance between the threshold levels of two adjacent comparators.

Shown with horizontal lines are the threshold levels of the n comparators. It can be seen from the comparator output waveforms $p_1$ through $p_N$ that as the ramp progresses down crossing the threshold levels of the different comparators one after the other, the comparators sequentially fire one after another. In normal operation the initial voltage can be anywhere in the indicated voltage range. Generally, there are some comparator threshold levels that are above the signal level and some that are below. The comparator bank acts as a flash ADC for the initial ramp voltage and the corresponding digital code may be captured in the form of thermometer coded digital word at the comparator outputs. This code forms the MSBs of the ADC and also indicates the sub-range where the analog input signal is located within the input voltage range.

As the ramp reaches the first threshold level below the starting point, the corresponding comparator changes state and produces an edge in its output waveform. The time difference between the start of the ramp and the edge is proportional to the LSBs of the input signal and is digitized by the TDC. It is not necessary to progress the ramp any further as all the information necessary to generate all the binary output bits has already been captured. In practice, the delay through a comparator has some dependency on the signal values immediately before and after it crosses the threshold. For this reason it may be beneficial to extend the ramp slightly past the comparator threshold. For the same reason, if the first comparator threshold is very close to the starting value of the ramp, it may be ignored and the next one used instead in the LSB formation. The MSBs need to be adjusted accordingly.

In a slow speed application where the TDC can be a simple digital counter, having a separate TDC for each comparator might be justifiable. However, a high speed application necessitates resolving time differences shorter than the fastest clock period available in the system, which makes the required TDC much more complex. It is highly desirable to share a single TDC with all the comparators. The disclosed method accomplishes this by using a combiner block 408 that takes the outputs of all comparators and combines them into a single signal that is passed to a single TDC.

One way to implement the combiner is to use a multiplexer and control the input selection with the MSBs. The drawback of this approach is that the MSBs are available only after some delay, which means that a waiting period has to be added before the start of the ramp, which in turn reduces the achievable sampling rate of the ADC.

It is preferable to have a combiner that doesn't need a priori knowledge of the MSBs. This can be done with a combinatorial logic function. One such function is the same as that used to form the LSB in thermometer to binary conversion. The combined waveform generated with this function is shown in FIG. 9 and labeled $p_{comb}$. In this waveform alternating comparators produces a rising edge and every other comparator a falling edge. This is generally not a problem for the TDC but may require some additional circuitry and indication from the MSB decoder to select the proper edge.

Figure 10:
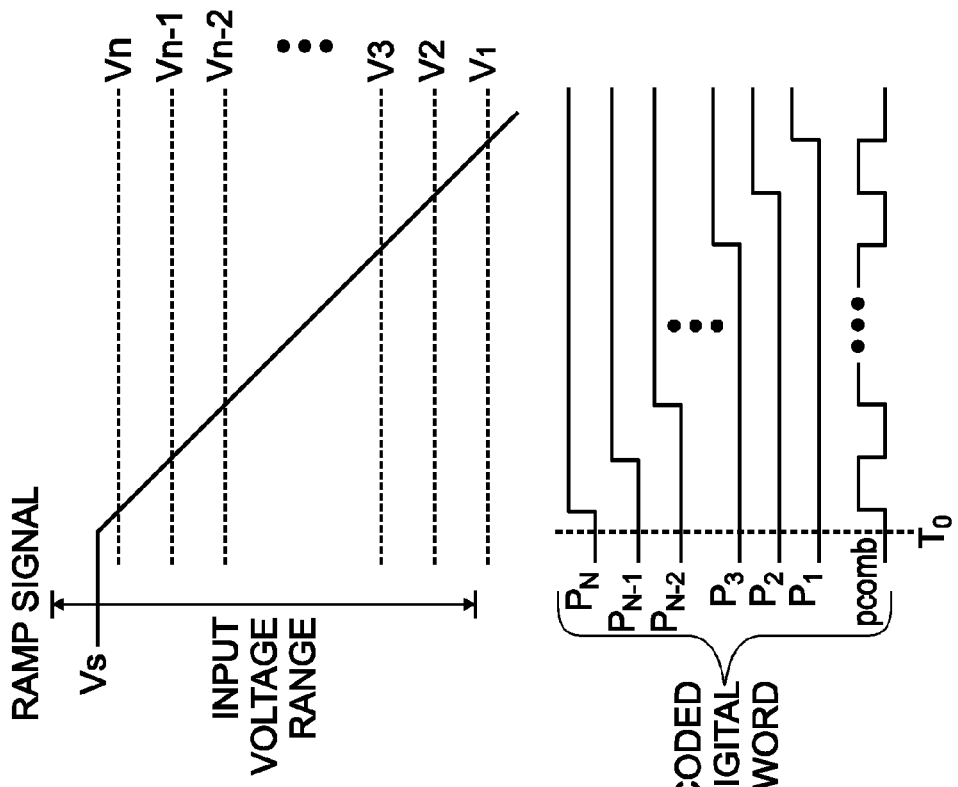
FIG. 10 illustrates transfer function waveforms from the comparator inputs to the pulse generator outputs in a pulse based combiner.

FIG. 10 illustrates transfer function waveforms from the comparator inputs to the pulse generator outputs in a pulse based combiner.

FIG. 11 illustrates exemplary waveforms associated with the combiner of FIG. 7. The combiner takes each comparator output and generates a short pulse when the signal changes state and then combines these n pulses into one signal. The pulse generation is enabled as an AND function between a comparator output and delayed and inverted comparator output. This produces a high pulse when the signal transitions from low to high. The pulse duration is the length of the combined delay of the delay element and the inverter. The n pulses are combined with an n-input OR function. The benefit of this type of combiner is that the timing information is encoded always in the same edge of the output waveform.

Figure 12:
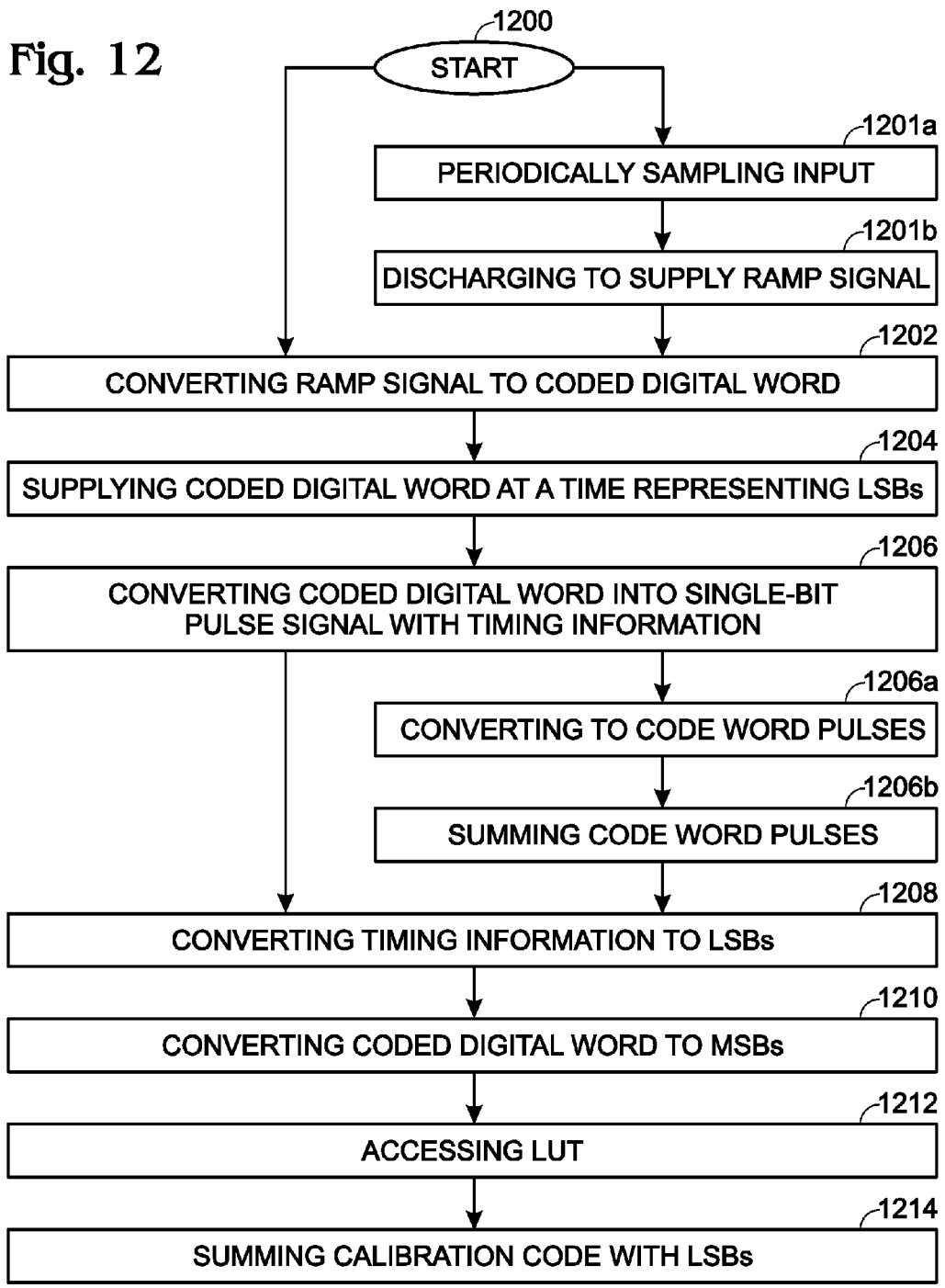
FIG. 12 is a flowchart illustrating a method for converting voltage-to-time-to-digital signals.

FIG. 12 is a flowchart illustrating a method for converting voltage-to-time-to-digital signals. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1200.

Step 1202 converts a continuous analog ramp signal representing a sampled continuous analog input into an n-bit coded digital word representing the q MSBs of a k-bit binary word, where q is an integer greater than 0, n is an integer greater than 1, and k is an integer greater than q. Step 1204 supplies at least one bit of the coded digital word at a time representing the p LSBs of the k-bit binary word. Step 1206 converts the coded digital word into a single-bit pulse signal containing timing information representing the p LSBs of the k-bit binary word at an output. Step 1208 converts the timing information into the p LSBs of the k-bit binary word. Step 1210 converts the coded digital word into the q MSBs of the k-bit binary word. In one aspect, Step 1212 accesses a LUT to retrieve a calibration code cross-referenced to the q MSBs from the k-bit binary word, and Step 1214 sums the calibration code with the p LSBs to supply the k-bit binary word.

In one aspect, Step 1201*a* periodically samples the continuous analog input, and Step 1201*b* discharges the sampled analog input at a predetermined rate to supply the ramp signal. In another aspect, converting the timing information in Step 1208 includes converting the timing information into the p LSBs in response to a difference in time between the start of the ramp signal and the start of the single-bit pulse signal. More explicitly, Step 1201*a* periodically samples in response to a clock signal, and Step 1206 converts the single-bit pulse signal timing information into the p LSBs with reference to the clock signal.

In one aspect, converting the ramp signal into the coded digital word in Step 1202 includes comparing the ramp signal to n parallel voltage references, each voltage reference having a different potential within a range between a maximum ramp signal voltage and a minimum ramp signal voltage.

In another aspect, converting the coded digital word into a single-bit pulse signal containing timing information in Step 1206 includes substeps. Step 1206*a* converts the bits in the coded digital word into code word pulses having a predetermined pulse width, and Step 1206*b* ORs the code word pulses to supply the single-bit pulse signal. In one aspect, supplying at least one bit of the coded digital word in Step 1204 includes supplying the bits of the coded digital word at an interval between bits responsive to a slope of the ramp signal. Then, converting the bits in the coded digital word into code word pulses having the predetermined pulse width in Step 1206*a* includes the predetermined pulse width being less than the interval.

A system and method have been provided for converting signals from the analog-to-time-to-digital domain. Examples of particular sub-circuits and hardware units have been presented to illustrate the invention. However, the invention is not limited to merely these examples. Other variations and embodiments of the invention will occur to those skilled in the art.

I claim:

1. A voltage-to-time-to-digital converter (VTDC) comprising:
    a level detector circuit to accept a continuous analog ramp signal representing a sampled continuous analog input, the level detector circuit converting the ramp signal into an n-bit coded digital word representing the q most significant bits (MSBs) of a k-bit binary word, where q is an integer greater than 0, n is an integer greater than 1, and k is an integer greater than q, and supplying at least one bit of the coded digital word at a time representing the p least significant bits (LSBs) of the k-bit binary word at an output;
    a combiner having n parallel inputs connected to the output of the level detector circuit, the combiner converting the coded digital word, and supplying a single-bit pulse signal containing timing information representing the p LSBs of the k-bit binary word at an output; and,
    a time-to-digital converter (TDC) having an input to accept the single-bit pulse signal and converting the timing information into the p LSBs of the k-bit binary word supplied at an output.

2. The VTDC of claim 1 wherein the TDC supplies the p LSBs in response to a difference in time between the start of the ramp signal and the start of the single-bit pulse signal.

3. The VTDC of claim 1 further comprising:
    a MSB decoder having an input to accept the coded digital word and an output to supply the q MSBs of the kbit binary word at an output.

4. The VTDC of claim 1 further comprising:
    a sample-and-decay circuit having an input to accept a continuous analog input, the sample-and-decay circuit periodically sampling the continuous analog input, discharging the sampled analog input at a predetermined rate, and supplying the ramp signal at an output.

5. The VTDC of claim 4 further comprising:
    a clock generator having an output to supply a periodic clock signal;
    wherein the sample-and-decay circuit has an input to accept the clock signal, the sample-and-decay circuit periodically sampling the continuous analog input in response to the clock signal; and,
    wherein the TDC has an input to accept the clock signal, the TDC converting the single-bit pulse signal timing information into the p LSBs with reference to the clock signal.

6. The VTDC of claim 4 wherein the sample-and-decay circuit comprises:
    a first switch having an input to accept the continuous analog input, a control port to accept the clock signal, and an output;
    a capacitor having a first terminal connected to the first switch output and a second terminal connected to a reference voltage;
    a discharge circuit having an input connected to the first terminal of the capacitor and an input to accept a control signal enabled in response to a complement of the clock signal, and an output to supply a discharge current.

7. The VTDC of claim 1 wherein the level detector circuit comprises:
    n voltage references, each voltage reference having a different potential within a range between a maximum ramp signal voltage and a minimum ramp signal voltage; and,
    n comparators, each comparator having a first input to accept the ramp signal, a second input connected to a corresponding voltage reference, and an output to supply a corresponding bit of the coded digital word.

8. The VTDC of claim 3 further comprising:
a look-up table (LUT) including calibration codes cross-referenced to MSBs from the kbit binary word; and,
a summing device having an input to accept the q MSBs of the k-bit binary word from the MSB decoder and an input to accept the p LSBs from the TDC, the summing device accessing the LUT to retrieve the calibration code associated with the q MSBs, summing the calibration code with the p LSBs, and supplying the k-bit binary word at an output.

9. The VTDC of claim 1 wherein the combiner comprises:
n pulse generators, each pulse generator having a delay circuit with a first delay duration to accept a corresponding bit of the coded digital word and to supply a delayed bit, an inverter connected to the delay output to supply an inverted delayed bit, and an AND gate having an input to accept the inverted delayed bit, an input to accept the bit of the coded digital word, and an output to supply a code word pulse having a pulse width equal to the first delay duration; and,
an OR circuit having an n inputs, each input connected to a corresponding pulse generator output, and an output to supply the single-bit pulse signal.

10. The VTDC of claim 9 wherein the level detector circuit supplies the bits of the coded digital word at an interval between bits responsive to a slope of the ramp signal; and,
wherein the pulse generator delay circuits have a first delay duration less than the interval.

11. A method for converting voltage-to-time-to-digital signals, the method comprising:
converting a continuous analog ramp signal representing a sampled continuous analog input into an n-bit coded digital word representing the q most significant bits (MSBs) of a k-bit binary word, where q is an integer greater than 0, n is an integer greater than 1, and k is an integer greater than q;
supplying at least one bit of the coded digital word at a time representing the p least significant bits (LSBs) of the k-bit binary word;
converting the coded digital word into a single-bit pulse signal containing timing information representing the p LSBs of the k-bit binary word; and,
converting the timing information into the p LSBs of the k-bit binary word.

12. The method of claim 11 wherein converting the timing information includes converting the timing information into the p LSBs in response to a difference in time between the start of the ramp signal and the start of the single-bit pulse signal.

13. The method of claim 11 further comprising:
converting the coded digital word into the q MSBs of the k-bit binary word.

14. The method of claim 11 further comprising:
periodically sampling the continuous analog input; and,
discharging the sampled analog input at a predetermined rate to supply the ramp signal.

15. The method of claim 14 wherein periodically sampling the continuous analog input includes periodically sampling in response to a clock signal; and,
wherein converting the single-bit pulse signal timing information into the p LSBs includes converting the single-bit pulse signal timing information with reference to the clock signal.

16. The method of claim 11 wherein converting the ramp signal into the coded digital word includes comparing the ramp signal to n parallel voltage references, each voltage reference having a different potential within a range between a maximum ramp signal voltage and a minimum ramp signal voltage.

17. The method of claim 13 further comprising:
accessing a look-up table (LUT) to retrieve a calibration code cross-referenced to the q MSBs from the kbit binary word; and,
summing the calibration code with the p LSBs to supply the k-bit binary word.

18. The method of claim 11 wherein converting the coded digital word into a single-bit pulse signal containing timing information includes:
converting the bits in the coded digital word into code word pulses having a predetermined pulse width; and,
ORing the code word pulses to supply the single-bit pulse signal.

19. The method of claim 18 wherein supplying at least one bit of the coded digital word includes supplying the bits of the coded digital word at an interval between bits responsive to a slope of the ramp signal; and,
wherein converting the bits in the coded digital word into code word pulses having the predetermined pulse width includes the predetermined pulse width being less than the interval.

\* \* \* \* \*

UNITED STATES PATENT AND TRADEMARK OFFICE
CERTIFICATE OF CORRECTION

| | | |
|---|---|---|
| PATENT NO. | : 9,323,226 B1 | |
| APPLICATION NO. | : 14/979186 | |
| DATED | : April 26, 2016 | |
| INVENTOR(S) | : Mikko Waltari | |

It is certified that error appears in the above-identified patent and that said Letters Patent is hereby corrected as shown below:

In the Claims

In column 8, line 29, claim 3, the term "k-bit" has been incorrectly printed as --kbit--.

In column 9, line 5, claim 8, the term "k-bit" has been incorrectly printed as --kbit--.

In column 10, line 27, claim 17, the term "k-bit" has been incorrectly printed as --kbit--.

Signed and Sealed this
Twenty-first Day of June, 2016

Michelle K. Lee
*Director of the United States Patent and Trademark Office*